(12) United States Patent
Robertson et al.

(10) Patent No.: US 9,191,194 B2
(45) Date of Patent: Nov. 17, 2015

(54) DATA TRANSFER CLOCK RECOVERY FOR LEGACY SYSTEMS

(71) Applicant: Texas Instruments Incorporated, Dallas, TX (US)

(72) Inventors: Iain Robertson, Bedford (GB); Richard Williams, Northampton (GB)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 6 days.

(21) Appl. No.: 13/755,609

(22) Filed: Jan. 31, 2013

(65) Prior Publication Data

US 2013/0202072 A1    Aug. 8, 2013

(30) Foreign Application Priority Data

Jan. 31, 2012    (GB) .................................. 1201580.6

(51) Int. Cl.
| | |
|---|---|
| *H04L 7/00* | (2006.01) |
| *H04L 25/00* | (2006.01) |
| *H04L 25/40* | (2006.01) |
| *H04L 7/04* | (2006.01) |
| *H04L 7/033* | (2006.01) |
| *H03L 7/08* | (2006.01) |
| *H03L 7/081* | (2006.01) |

(52) U.S. Cl.
CPC ............... *H04L 7/04* (2013.01); *H03L 7/0807* (2013.01); *H03L 7/0814* (2013.01); *H04L 7/033* (2013.01); *H04L 7/0025* (2013.01)

(58) Field of Classification Search
CPC ..... H04L 7/033; H04L 7/0337; H04L 7/0338; H03L 7/0814; G06F 1/10

USPC .................................. 375/130–239, 242–377
See application file for complete search history.

(56) References Cited

U.S. PATENT DOCUMENTS

| | | | | |
|---|---|---|---|---|
| 7,277,031 | B1 * | 10/2007 | Lo et al. ........................ | 341/100 |
| 7,359,407 | B1 * | 4/2008 | Mattos et al. .................. | 370/509 |
| 7,568,137 | B1 * | 7/2009 | Kellermann ................... | 714/725 |
| 7,756,194 | B1 * | 7/2010 | O'Connor et al. ............. | 375/150 |
| 7,782,990 | B1 * | 8/2010 | Snow ............................. | 375/355 |
| 8,000,425 | B2 * | 8/2011 | Chan et al. .................... | 375/354 |
| 8,015,429 | B2 * | 9/2011 | Balamurugan et al. ....... | 713/600 |
| 8,320,770 | B2 * | 11/2012 | Nedovic ........................ | 398/155 |

(Continued)

FOREIGN PATENT DOCUMENTS

GB          2473748 B        12/2011

OTHER PUBLICATIONS

Stauffer et al. "High Speed Serdes Devices and Applications", Springer, 2008, p. 116.

*Primary Examiner* — James M Perez
(74) *Attorney, Agent, or Firm* — Tuan D. Chen; Frank D. Cimino

(57) ABSTRACT

The present invention provides method and apparatus for adapting a relatively high data rate second order serdes receiver to receive relatively low data rate serial data, the receiver having jog realignment by and having means for receiving the serial data as a plurality of repeated bits at the high data rate; framing the data as frames of repeated bits of the same value; examining the bits of the frame for the presence of bits which are not of the same value; upon detecting such a presence that is indicative of a framing error jogging the serdes receiver for frame realignment; and supplying to an output of the serdes receiver one of the bits of said same value from each frame at the low data rate.

9 Claims, 3 Drawing Sheets

(56) References Cited

U.S. PATENT DOCUMENTS

| | | | |
|---|---|---|---|
| 2007/0089002 A1* | 4/2007 | Robertson | 714/726 |
| 2008/0031312 A1* | 2/2008 | Haas et al. | 375/221 |
| 2009/0086870 A1* | 4/2009 | Mohiuddin | 375/371 |
| 2012/0290885 A1* | 11/2012 | Mobin et al. | 714/56 |
| 2013/0070835 A1* | 3/2013 | Sindalovsky et al. | 375/238 |
| 2013/0202072 A1* | 8/2013 | Robertson et al. | 375/371 |

* cited by examiner

DATA TRANSFER CLOCK RECOVERY FOR LEGACY SYSTEMS

FIELD OF THE INVENTION

This application claims priority under 35 USC §119(e)(1) of European Application Number GB 1201580.6, filed on Jan. 31, 2012.

BACKGROUND

The present invention relates to clock recovery during data transfer in electrical systems. Transmitted data is usually synchronised to a clock signal at a transmitter to ensure correct timing of the transmitted data and compliance with specification in terms of jitter, etc. In systems where the clock signal is transmitted alongside the data, extraction of the data is the straightforward task of examining the data signal in synchronism with the clock. In systems where the clock is not so transmitted a replica clock may be recovered from the data itself and used likewise. For example 1000BASE-X and 10GBASE-KR Ethernet are single wire pair systems in which there is no clock transmission. In many situations (typically involving high speed, long distance or significant noise) clock recovery itself is a highly non trivial task.

It is neither always nor necessarily the case but single wire pair data transmission between or within equipment is often performed by a device which receives data to be transmitted in parallel from a source, renders it into serial form and transmits it, typically at higher speed, over the single wire pair to a second receiver device which includes a clock and data recovery circuit (CDR) to recover a clock signal so that the now serial data may be extracted an expanded back out to parallel form for use at the receiver location. Typically, both devices are similar so that transmission may occur in either direction. Such devices are often referred to as SerDes devices and a typical arrangement is depicted in FIG. 1, wherein it will be noted that the receiving serdes device is shown to include CDR circuitry.

The purpose of the clock recovery circuitry may be seen as identifying two neighbouring transitions (for example by oversampling the incoming data stream and looking for two adjacent non-matching oversampled values) and placing a data sampling point mid way between them to capture a data value. This is depicted in FIG. 2.

Of course not every adjacent data pair will be subject to transition and so the clock recovery circuitry may be free running to place sample points at equivalent positions until a next transition occurs. This makes CDR vulnerable to any jitter that was present in the original clock to which the data was synchronised. Clearly if that jitter resulted in transitions that were too close (or far apart), then the sample points are likely to be consistently too early (or late).

If jitter is too great, CDR can break down completely and steps must be taken to ensure this cannot happen. To this end, for example, most transmission specifications set an upper limit on jitter with which a receiver is expected to cope.

As SerDes speeds have increased, more and more complex clock recovery circuits have become available which incorporate corrections for various anticipated errors and difficulties. Examples are discussed in United Kingdom Patent Specification GB2,473,748B and numerous others. Usually CDR is either first order, in which a next sample point is determined from current measurements, or second order in which previous corrections are taken into account: GB2,473,748B is exemplary of both.

As mentioned above, the SERDES devices which communicate between or within equipment are usually similar in nature in that they perform to similar standards and protocols. However, this may not be the case where legacy equipment is involved. New equipment may be required to perform data transfer not only with similar new equipment but also with equipment which operates according to an earlier standard. In the field of data transfer, earlier often means slower. For example, it may be desired to interface equipment designed for 10GBASE Ethernet (10 GHz clock) with equipment designed for 1000BASE Ethernet (1 GHz clock). Fortunately, this should be achievable since the specification of 10GBASE Ethernet requires that transfer speed extend down to 1 GHz. However, if it were desired to connect the same equipment to legacy equipment conforming to 100BASE-FX (100 MHz clock), the situation would be different since 100 MHz is outside the range provided for in 10GBASE. Of course, the equipments may be physically connected together without electrical incompatibility but that does not means that data transfer is possible, the basic problem is that in the upstream direction (100BASE-FX to 10GBASE) the CDR circuitry in the SerDes device is unable to reliably recover a clock from data at the slower data rate.

In the downstream direction, data transfer would be possible if each bit to be transferred from the 10G Serdes were simply repeated 10 times at the lowest permitted clock speed, thereby making the data appear to be clocked at 100 MHz. Since these bits would be synchronised to an internal clock of the Serdes which satisfies the jitter requirements of 10GBASE internet, they should be more than accurate enough for the 100BASE Serdes and downstream data transfer should work. The only overhead would be the repeat function, which likely could be accommodated in software configuring the SERDES.

In the upstream direction, unfortunately, the same approach cannot be used straightforwardly. Although at the upstream serdes the data could be regarded as arriving with each bit repeated 10 times and thus the problem potentially solved simply by discarding 9 bits out of each 10, it is in fact unlikely that the data could be recovered at all. If the slower clock were subject to 10% jitter, that is a whole bit time at the 1G clock speed and clearly the upstream SERDES CDR circuit could not function at all with such ambiguity as the transition boundaries are entirely overlapping. A prudent designer would expect to allow for 20% deterioration from an ideal channel due to noise, jitter and inter symbol interference, so the scale of this problem may thus be appreciated.

Clearly a hardware solution at the downstream end is required to adapt the legacy equipment such as a data resynchroniser to a tightly specified clock or in the extreme a 1000BASE serdes itself Unfortunately such difficulty and cost may negate the reasons for retaining the legacy equipment in the first place. According the present invention has been made in the course of realising a different approach of using resources within a typical 10G serdes.

According to the present invention there is provided apparatus and method as set forth in the claims.

DETAILED DESCRIPTION

The present invention moreover provides method and apparatus for adapting a relatively high data rate second order serdes receiver to receive relatively low data rate serial data, the receiver having jog realignment and having means for receiving the serial data as a plurality of repeated bits at the high data rate; framing the data as frames of repeated bits of the same value; examining the bits of the frame for the presence of bits which are not of said same value; upon detecting such a presence that is indicative of a framing error jogging said serdes receiver for frame realignment; and supplying to an output of said serdes receiver one of the bits of said same value from each frame at said low data rate. The second order circuitry of said serdes receiver is used to impose a drift on said serial data of a magnitude greater than any expected drift or jitter on said serial data, the imposed drift being corrected as aforesaid.

Figure 1:
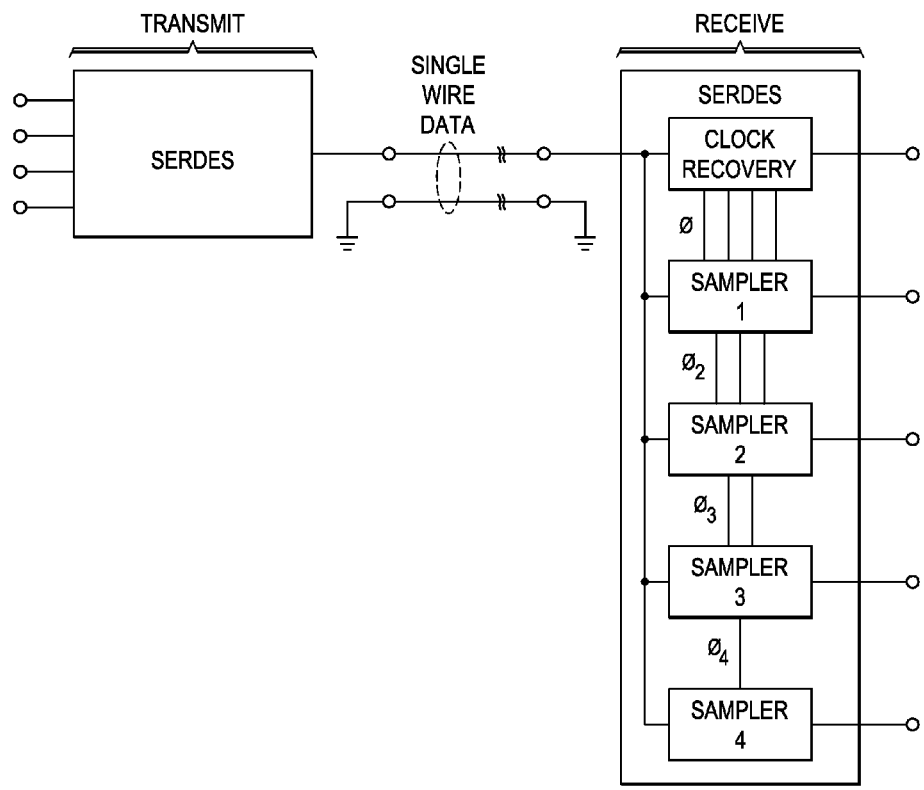
FIG. 1 is a block diagram of a Serializer/Deserializer (SerDes) device (Prior Art).
Figure 2:
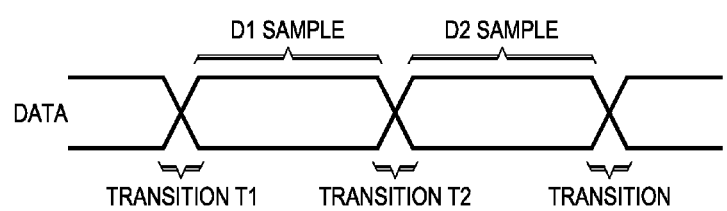
FIG. 2 is a timing diagram of clock recovery signals. (Prior Art)
Figure 3:
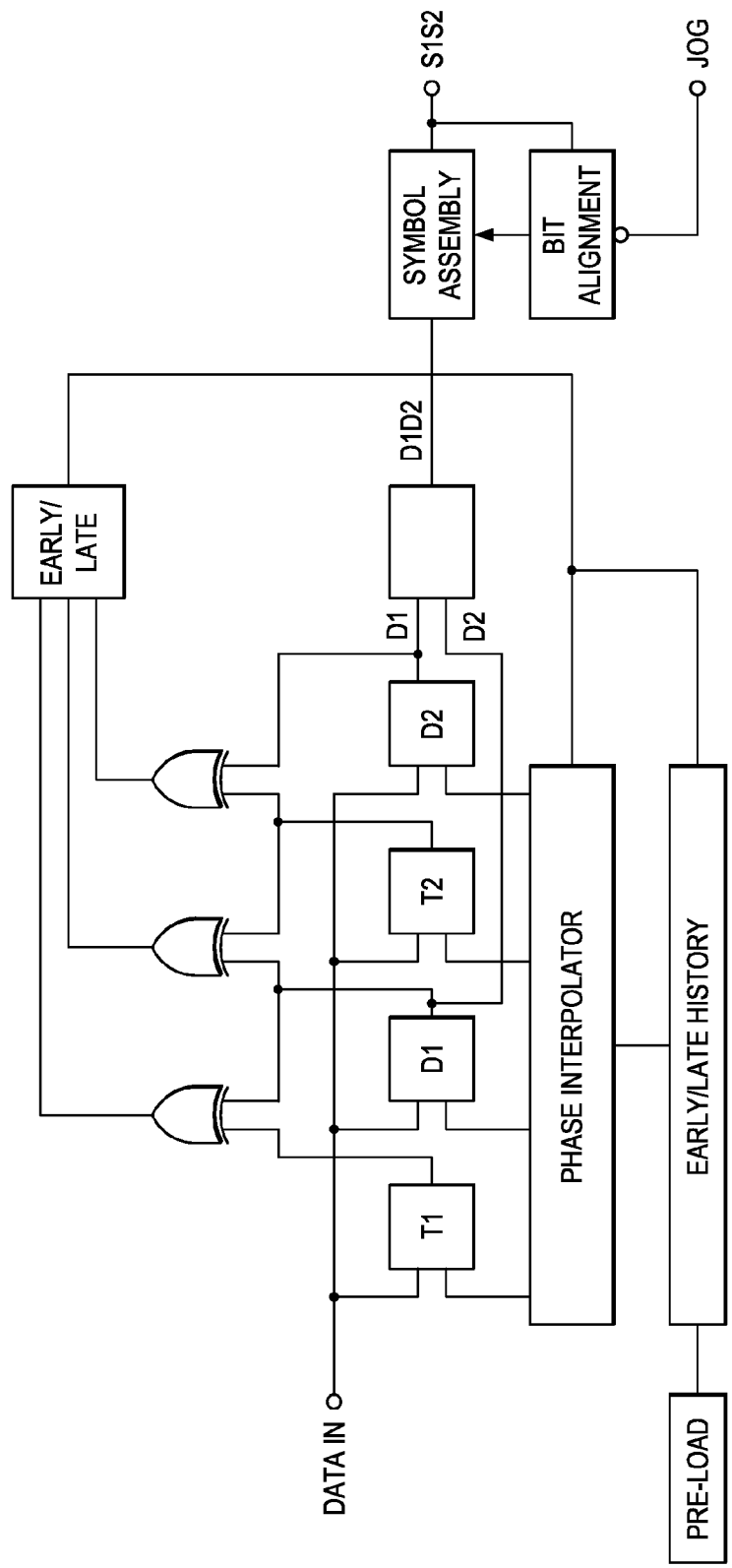
FIG. 3 is a schematic diagram of a SerDes arrangement according to an embodiment of the invention.

An exemplary serdes arrangement as may benefit from an implementation of the present invention is depicted in FIG. 3. The serialised input data signal is connected to for example four samplers which take samples at progressive later phase points in the input cycle as defined by a phase interpolator. The samples correspond to two data samples D1 and D2 and two transition point samples T1 and T2, as in FIG. 2.

A conventional bang-bang early/late detector is used based upon comparing neighbouring samples. The operation of such an arrangement is well known and documented for example by Stauffer et al in "High Speed Serdes Devices and Applications", Springer, 2008; page 116. Suffice to say that the detector serves to advance the sampling phases provided by the phase interpolator if the sampling is late and to retard the sampling phases provided by the phase interpolator if the sampling is early. Early/late history is recorded and may be used pre-emptively to advance or retard the phases if a long history of either all early or all late has been recorded. As such, the arrangement constitutes a second order CDR arrangement.

The data samples are captured in order from the two samplers and fed to a symbol assembly unit where a plurality of consecutive samples (i.e. output bits) is framed into a symbol, word or byte. It is possible that even if the data bits have been correctly received, the framing is incorrect. A jog input to the serdes is provided for the use of downstream data decoding equipment that may advance the framing by one bit at a time. This effectively moves the bit position of data either earlier or later in the frame.

The operation of such a serdes configured for fast (e.g. 10G) reception will now be considered for the case where it receives data from a legacy (e.g. 100BASE) transmitter.

The serdes may be expected to sample signals down to a 1 G MHz, so the incoming data at 100 MHz may be considered as a repeated bit pattern, 10 repetitions at a time. The problem is that the data cannot be locked because the transitions are too far apart and outside the 10G clock recovery specification.

Figure 4:
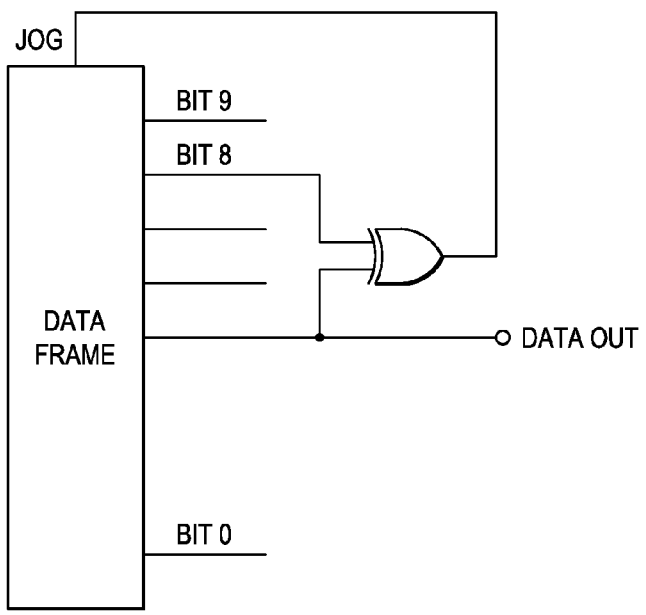
FIG. 4 is a schematic diagram of a circuit for clock recovery according to an embodiment of the invention.

FIG. 4 shows an arrangement which can alleviate this problem

Figure 5A:
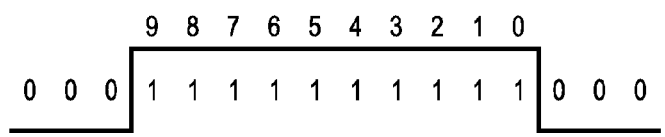
FIG. 5a is an illustration of a transition sequence with 10 consecutive bits according to an embodiment of the invention.

FIG. 5(a) shows a transition sequence with 10 consecutive bits. It will be observed that the 10 consecutive bit sequence is correctly framed and therefore bit 5 will be correctly delivered to the output as a value 1 for the single bit which this frame represents at the legacy data rate.

Figure 5B:
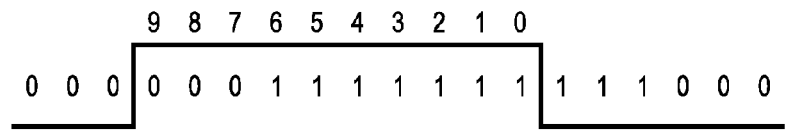
FIG. 5b is a an illustration of where data is being sampled too late and the data frame frame has slipped according to an embodiment of the invention.

FIG. 5(b) shows an example where the data is being sampled too late and the data frame has slipped, so that only 6 bits have the correct value. Since the slippage is to the point where compared bits 5 and 8 have different value, the arrangement will institute a jog which increases the sampling timing over one cycle. In the present case, this effectively skips one input bit to stretch the frame by creating an 11 bit frame so that the frame is realigned one bit earlier on the next sampling. It will be observed, however that a value of "1" (bit 5) is still correctly delivered as the output.

Clearly, if jitter or timing error were causing slippage in the opposite sense, an equivalent procedure could be implemented based on comparison of the higher order bits to institute an opposite jog to retard sampling.

Unfortunately, in typical serdes applications only an advancing jog is implemented. This is because since serdes circuitry is already operating at high speed, a reduction in sampling period is unrealistic. Moreover a delaying realignment (unlike an advancing realignment) is perfectly feasible in the receiving equipment and so there is no need for hardware in the serdes itself to provide such a function for the connected equipment.

In this situation the jog arrangement alone cannot be used for clock recovery as only late framing errors can be corrected.

In accordance with a further aspect of the present invention, a number representing a positive drift is loaded into the early/late history register of the serdes receiver, so that the sampling phase is advanced with respect to that determined by the bit rate. Now the situation is that the input data waveform is always sampled early and as a consequence will always drift toward the situation depicted in FIG. 5(b). However, this is not a problem, since it is precisely this form of timing error which may be routinely corrected by the jog mechanism described above.

For example, the 100BASE-FX standard allows for up to ±200 ppm of frequency offset. By loading a suitable number into the early/late history register, the SerDes will introduce an offset in the effective sampling of for example 256 ppm, shifting the possible net frequency offset to between +56 ppm and +456 ppm. This offset being always positive, the absence of an advancing jog function is overcome.

The choice of which bit to supply to the output is essentially arbitrary (since all 10 bits are the same), as is the choice of which bit to use to detect that the drift is causing the framing error to become severe, and the amount of correction to apply in terms of the number of bits by which the advance the timing when drift is detected. However, in accordance with the present invention, a comparison of bits that are separated by about a third of the overall frame length, for example bits 5 and 8 together with a one bit advance is considered advantageous for the 10 bit (single bit in legacy system) case. An advance of about 1 in 10 is also to advantage.

If the perceived advance is indeed due to drift, there are many schemes that could be made to work. However the perceived drift may in fact be jitter which may disappear or even reverse on a subsequent cycle. Hence is it advantageous to advance the framing by one bit only; it would be deleterious to advance by more in response to jitter. Examining bit 8 allows for two bits of potential jitter to cause no effect and bit 5 is delivered as the bit most insulated from the effect of jitter. Delivery of the bit at about the mid point of a frame is advantageous.

What is claimed is:

1. A method of adapting a high data rate Serializer/Deserializer (SERDES) receiver to receive serial data transmitted at a low data rate by a legacy transmitter, the method comprising:

receiving, using the SERDES receiver, the serial data as a stream of bits and sampling the stream of bits at a high sampling rate;

grouping, using the SERDES receiver, a portion of the sampled stream of bits into a frame;

detecting a frame slip when two bits within the frame have different values at the deserialized output of the SERDES receiver;

upon detecting the frame slip, realigning the frame along the sampled stream of bits until the two bits at the deserialized output of the SERDES share a uniform bit value; and supplying the uniform bit value as a data output of the SERDES receiver representing the data values of the received serial data.

2. The method of claim 1, wherein:
the sampled stream of bits includes a first received bit and a last received bit; and
the realigning the frame includes shifting the frame towards the first received bit of the sampled stream of bits.

3. The method of claim 1, further comprising:
increasing the portion of the sampled stream of bits being grouped into the frame in response to the results of the realigning step.

4. The method of claim 1, further comprising:
drifting the sampled stream of bits by a magnitude greater than an expected jitter of the received serial data.

5. The method of claim 1, wherein:
the frame includes a frame length of bits; and
the two bits detected in the frame slip are separated by one-third of the frame length of bits.

6. The method of claim 5, wherein:
the frame length is 10 bits; and
the two bits detected in the frame slip are bit 5 and bit 8 of the frame.

7. The method of claim 5, wherein the realigning the frame includes shifting the frame by one-tenth of the frame length.

8. The method of claim 1, wherein the realigning the frame includes shifting the frame by one bit.

9. The method of claim 1, wherein the uniform value is extracted from a bit located at a midpoint of the frame.

* * * * *